(12) United States Patent
Lee

(10) Patent No.: US 6,436,754 B1
(45) Date of Patent: *Aug. 20, 2002

(54) SELECTIVE SALICIDE PROCESS BY REFORMATION OF SILICON NITRIDE SIDEWALL SPACERS

(75) Inventor: Yong Meng Lee, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 09/863,221

(22) Filed: May 24, 2001

Related U.S. Application Data

(63) Continuation of application No. 09/246,292, filed on Feb. 8, 1999, now Pat. No. 6,258,648.

(51) Int. Cl.$^7$ ................ H01L 21/8234; H01L 21/8244; H01L 21/8242; H01L 21/4763
(52) U.S. Cl. ................ 438/238; 438/649; 438/253
(58) Field of Search .................. 438/238, 649, 438/253

(56) References Cited

U.S. PATENT DOCUMENTS

| | | | | |
|---|---|---|---|---|
| 4,912,061 A | * | 3/1990 | Nasr | |
| 5,510,648 A | * | 4/1996 | Davies et al. | |
| 5,668,024 A | * | 9/1997 | Tsai et al. | |
| 5,672,527 A | * | 9/1997 | Lee | |
| 5,719,079 A | * | 2/1998 | Yoo et al. | |

* cited by examiner

Primary Examiner—David E. Graybill
(74) Attorney, Agent, or Firm—George O. Saile; Stephen B. Ackerman

(57) ABSTRACT

A new method of forming selective salicide structures is described whereby robust salicide structures are formed on exposed logic FET's, while blocking salicide formation on memory FET's. Thus, yielding logic FET's with robust salicide structures which exhibit low sheet rho lines and contacts, while blocking salicide formation on the sensitive memory FET's which operate at low voltage and have low leakage, shallow junctions. A conformal layer of thick silicon nitride in conjunction with a salicide blockout mask forms robust selective salicide structures. These structures exhibit low leakage and lack leakage problems caused by bridging, silicide ribbons or stringers.

5 Claims, 4 Drawing Sheets

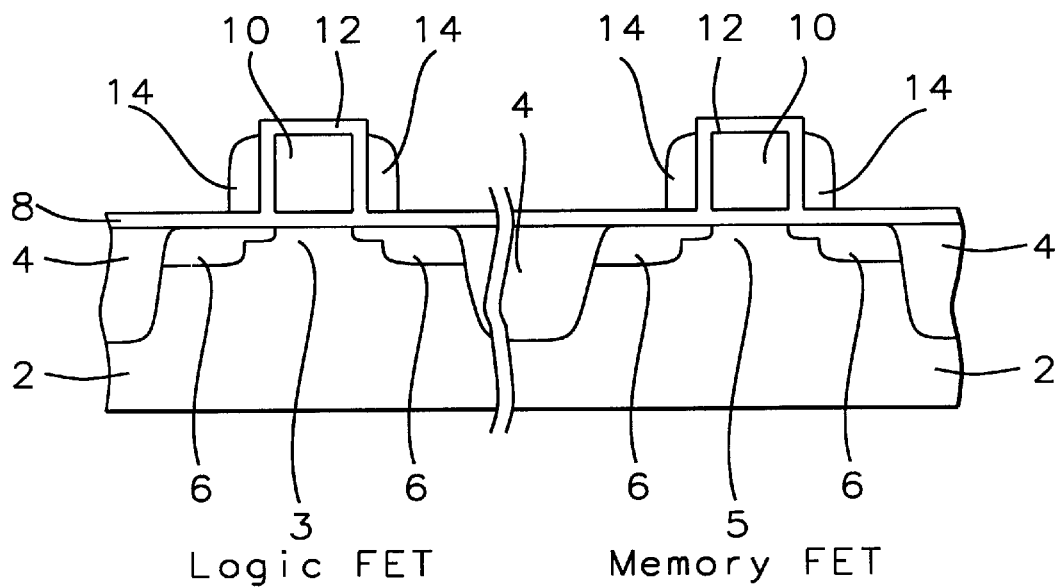
FIG. 1A – Prior Art
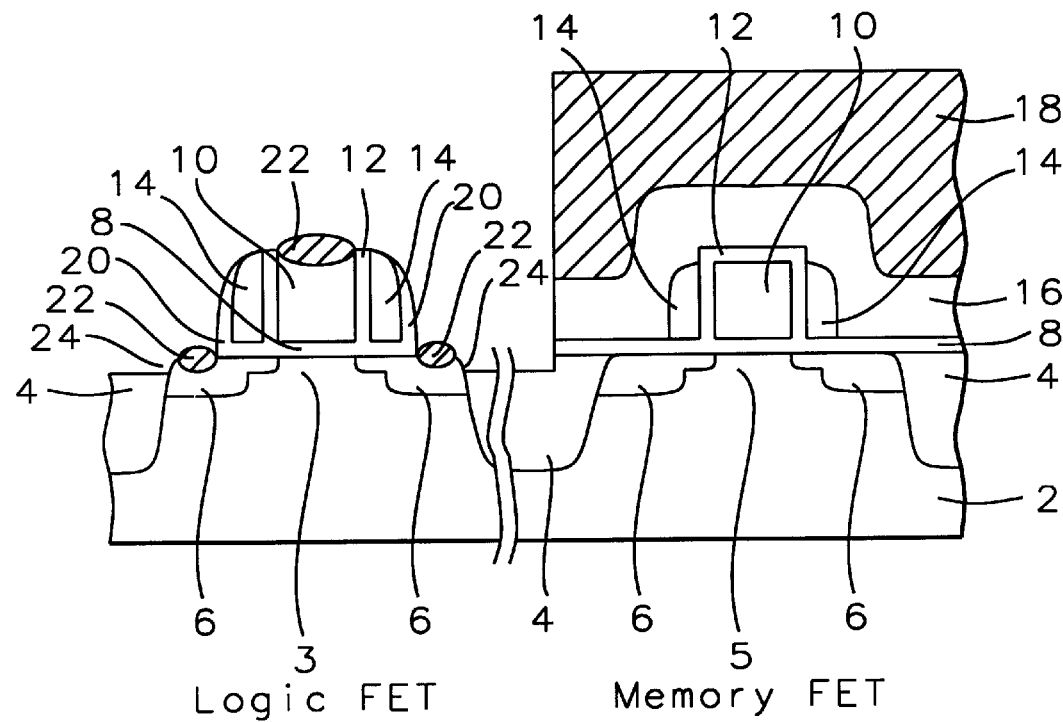
FIG. 1B – Prior Art

SELECTIVE SALICIDE PROCESS BY REFORMATION OF SILICON NITRIDE SIDEWALL SPACERS

This application is a continuation of U.S. patent application Ser. No. 09/246,292, filed Feb. 8, 1999, U.S. Pat. No. 6,258,648.

FIELD OF THE INVENTION

This invention relates to a method of fabrication used for semiconductor integrated circuit devices, and more specifically to a method whereby a selective salicide process forms salicide on exposed logic FET's, while blocking salicide formation on memory FET's.

DESCRIPTION OF PRIOR ART

In the fabrication of semiconductor integrated circuits the salicide process is well documented for MOSFET and CMOS device formation. Methods are presented which differ in the number of masking steps and processing steps from the present invention.

U.S. Pat. No. 5,672,527 to Lee teaches a method for fabricating an electrostatic discharge protection circuit. The invention describes a process that features only one photo mask to form ESD protection circuit without the salicide and a LDD, lightly doped drain structure.

U.S. Pat. No. 5,719,079 to Yoo et al describes a salicide process for an embedded logic device. A method forming a local interconnect in an SRAM simultaneously with the formation of a salicide in logic devices is described.

U.S. Pat. No. 5,668,024 to Tsia et al is a method to form CMOS devices with a dual sidewall insulator spacers to reduce salicide bridging, as well as, using these regions for pocket implantation regions. The pocket implantation regions are used to reduce punch-through leakage.

U.S. Pat. No. 5,510,648 to Davies et al shows a process for forming salicide with a gate and insulating sidewall spacers of oxide, nitride. The patent teaches that the insulated gate device formed is well suited for the design of low voltage circuits due to the small variations of threshold voltage.

U.S. Pat. No. 4,912,061 to Nasr teaches a method of fabricating CMOS devices using salicide process using a disposable silicon nitride spacer, metal silicide and a single implant step for source, drain and gate. Dual sidewall spacers of oxide/nitride are described with the nitride spacer being removed subsequently.

SUMMARY OF THE INVENTION

It is a general object of the present invention to provide an improved method of forming an integrated circuit in which a selective salicide process forms salicide on exposed logic FET's, while blocking salicide forming on memory FET's. Thus, yielding logic FET's with robust salicide structures which exhibit highly conductive lines and contacts, while blocking salicide formation on the sensitive memory FET's which operate at low voltage and have low leakage, shallow junctions. A conformal layer of thick silicon nitride in conjunction with a salicide blockout mask forms robust selective salicide structures. These structures show low leakage and lack the usual problems associated with conventional salicide processing, such as, silicide bridging, "ribbons" or "stringers".

In accordance with the present invention, the above and other objectives are realized in the first embodiment of the present invention by using a method of fabricating robust selective, salicide structures using a second thick conformal layer of dielectric which is refractory and can be selectively etched compared with the etch rate of silicon oxide. This thick conformal layer of refractory dielectric forms a salicide mask, whereby logic FET's receive the salicide process and memory FET's are protected by the salicide mask. Hence, a selective salicide process is described in the present invention.

The following process information is provided as a background to the present invention. Prior to said second thick conformal layer of refractory dielectric, conventional processing is provided. For example, a first conformal silicon nitride layer is deposited on oxidized polysilicon gate structures. Anisotropically etch of the silicon nitride layer forms sidewall spacers on the sidewalls of said oxidized polysilicon gate structures. Exposed source and drain regions are then ion implanted forming lightly doped source/drain regions underneath the sidewall structures. Rapid thermal annealing activates the ion implanted dopants while limiting diffusion. The said silicon nitride spacers are etched off leaving oxidized polysilicon gate structures with implanted source and drain regions. Both logic and memory FET's are processed simultaneously at this stage of the process.

In the first embodiment of the present invention, the second thick conformal layer of refractory dielectric material is any material which meets the general requirements for the process. One of the key requirements is that it must have a high etch selectivity to that of silicon dioxide. In the second embodiment the material is listed as thick silicon nitride. This second conformal material protects the memory FET's from salicidation.

In the second embodiment of the present invention, the above and other objectives are realized by using the method of selective salicide formation by depositing a second conformal thick layer of silicon nitride, in the thickness range of approximately 500 Angstroms to approximately 1500 Angstroms. Said second thick layer of silicon nitride is patterned by photolithography by applying a salicide blockout mask to the memory FET's. Anisotropic silicon nitride RIE (Reactive Ion Etch) etching forms robust silicon nitride sidewall spacer structures on the sidewalls of the oxidized silicon nitride gate structures. Greater integrity of the sidewall spacer is achieved with the said thick silicon nitride process.

The blockout photolithography mask is subsequently removed by stripping the resist. Salicide formation process is applied by depositing metals, such as, Ti, Ta, Mo, W, Co, Ni, Pd, Pt onto the substrate. Low electrical resistance, good adhesion and low mechanical stress are some of the more desirable properties in choosing which metal to deposit and by what method to deposit the silicide metal. Silicide formation occurs by diffusion of silicon atoms through the polysilicon to the surface where the reaction with the metal occurs. In some instances, a two step RTA, Rapid Thermal Anneal, in an inert atmosphere converts the silicide from C49 crystal structure to the preferred C54 low electrical resistance structure. Salicide formation occurs in the exposed polysilicon areas and at the top of the source/drain areas, hence it is a self-aligned process. Deleterious bridging, which is silicide formation between the polysilicon and closely spaced source/drain regions is prevented by the robust silicon nitride sidewall structures.

The thick silicon nitride, the silicide protection layer and nitride sidewall spacers are subsequently removed by selectively etching the nitride while leaving the oxide layers and salicide layers intact. This is one of the key aspects of the present invention.

The salicide formation takes place on all the exposed silicon surfaces, that is, at the top of the polysilicon gate and in the diffusion regions. However, the silicon nitride spacers that see exposure to the selective salicide processing metal do not react to form silicide.

The silicon oxide loss or recess in the field isolation region is significantly greater for conventional processing. The reason for this is due to fact that the prior art or traditional process etches silicon oxide to form the salicide mask (self-aligned silicide mask). Therefore, the field silicon oxide, is also etched in the traditional process etch. This non-selective etch results in a recess in the field oxide region. These effects expose the silicon at the edge of the active source/drain regions and cause deleterious silicide formation to occur. This results in leakage around the source/drain. The present invention describes a process whereby thick dielectric silicon nitride can be the refractory material that forms the salicide mask and it can be selectively etched compared with silicon oxide. The selectively etch process minimizes the leakage problem.

In addition, after the salicide process is complete, said thick silicon nitride layer can be anisotropically etched to form sidewall spacers on the memory devices.

BRIEF DESCRIPTION OF THE DRAWINGS

The object and other advantages of this invention are best described in the preferred embodiments with reference to the attached drawings that include:

FIGS. 1A–1B which in cross-sectional representation illustrate the prior art methods whereby selective salicide formations result in leakage on the sidewall spacers and residual bridging, "ribbons" or "stringers" associated with silicide formation in undesirable regions.

Figure 2:
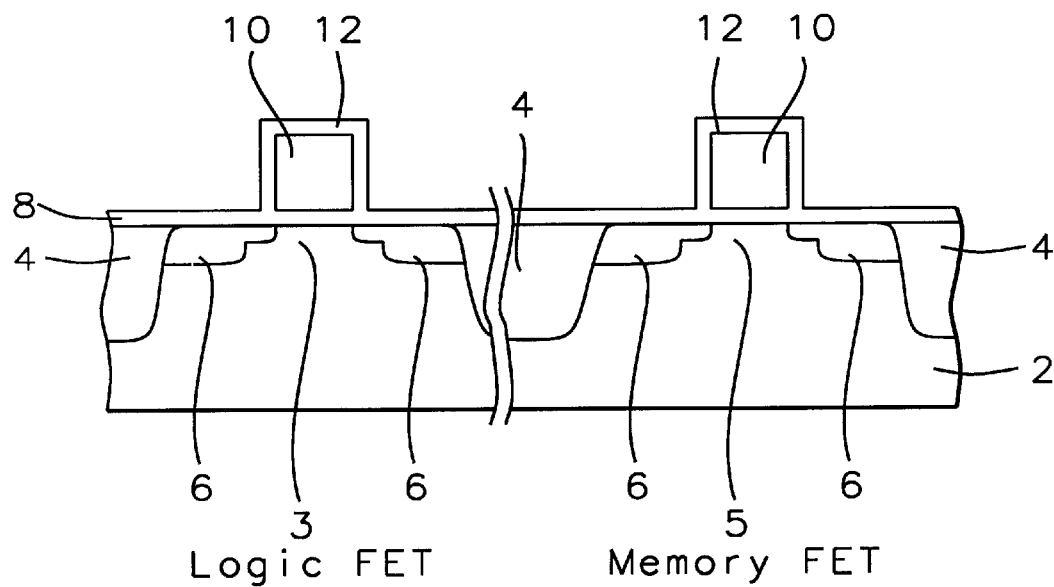
Figure 6:
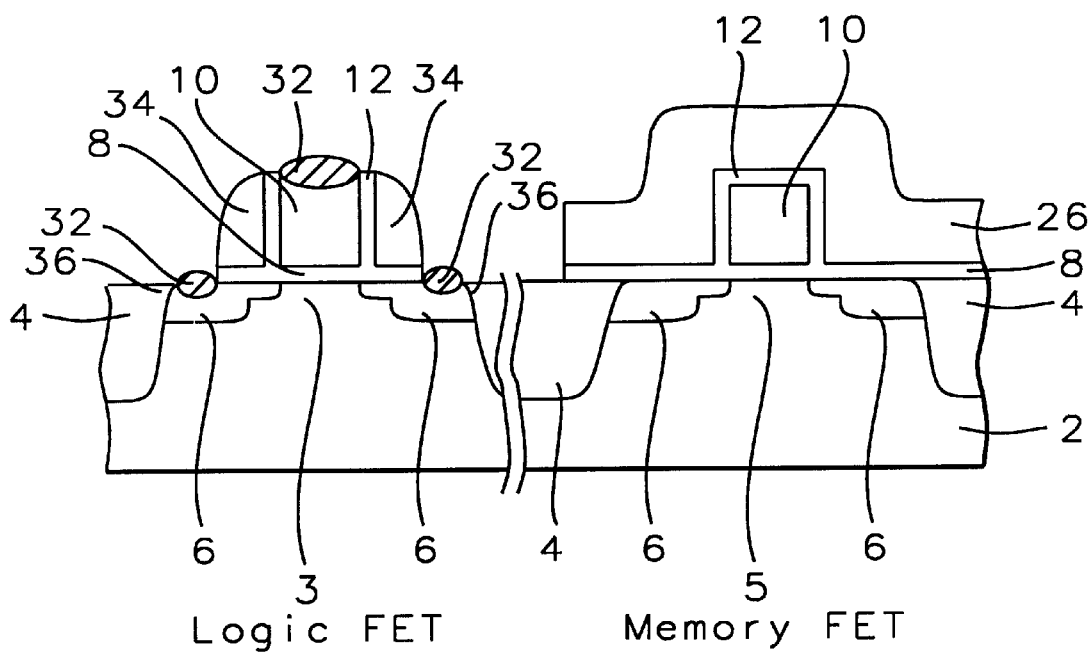

The method of the preferred embodiment of the present invention in cross-sectional representation is illustrated in starting structure in FIG. 1A and proceeding from FIG. 2 through to FIG. 6.

DESCRIPTION OF THE PREFERRED EMBODIMENTS

Referring now more particularly to FIG. 1A, there is shown in cross-section the starting structures of both prior art and the present invention. FIG. 1A sketches two FET structures, the one on the left-hand side represents a logic FET 3 and the one on the right-hand side represents a memory FET 5. The substrate 2 is a semiconductor substrate with implanted source and drain regions 6. Note the lightly doped portions of the source and drains 6 are the necked down, shallow junctions shown in the figures. Thick field oxide 4 electrically isolates the FET's. Polysilicon gate structures 10 with gate oxide 8 and polysilicon oxide layer 12 are sketched. Silicon nitride sidewall spacers are provided and are depicted in FIG. 1A.

In FIG. 1B is sketched the type of FET structure that results from Prior Art processing using a thick oxide layer 16 and salicide blockout mask 18. Salicide is formed selectively on the logic FET 3 in exposed silicon and polysilicon regions 22 with silicon nitride sidewall spacers 14 and TEOS deposited oxide sidewall spacers 20. Electrical leakage paths 24 due to silicide bridging tend to develop near the edges of the FET structure.

Figure 3:
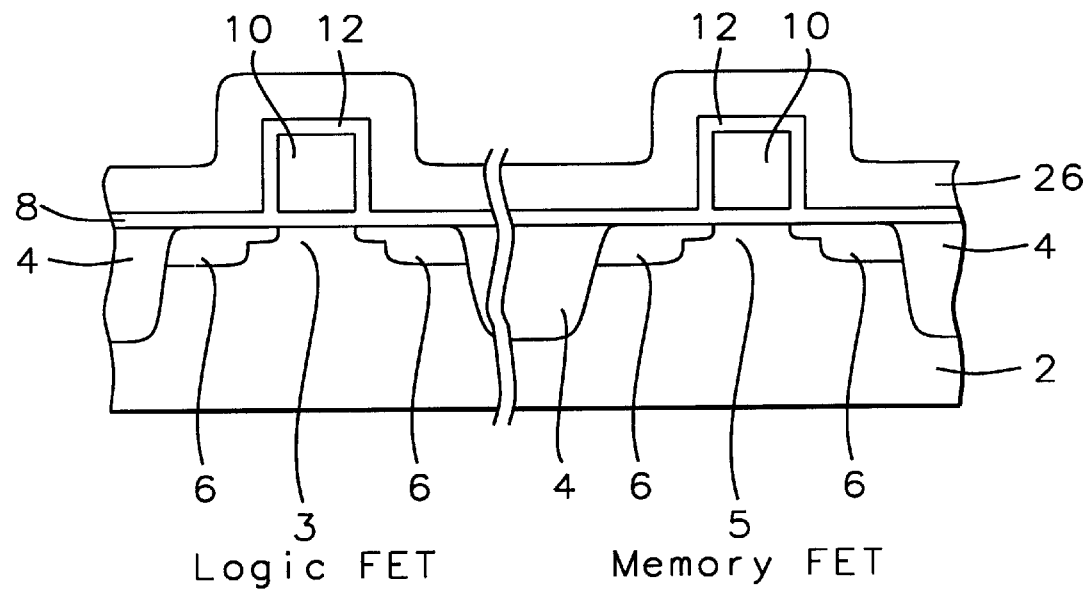
Figure 4:
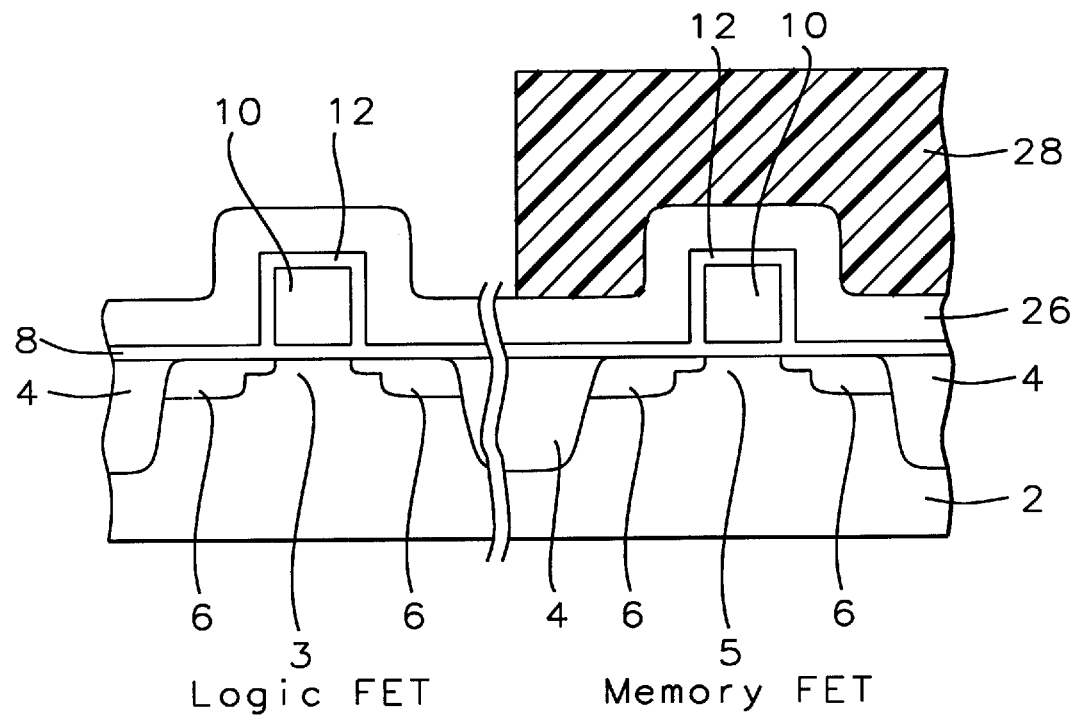
Figure 5:
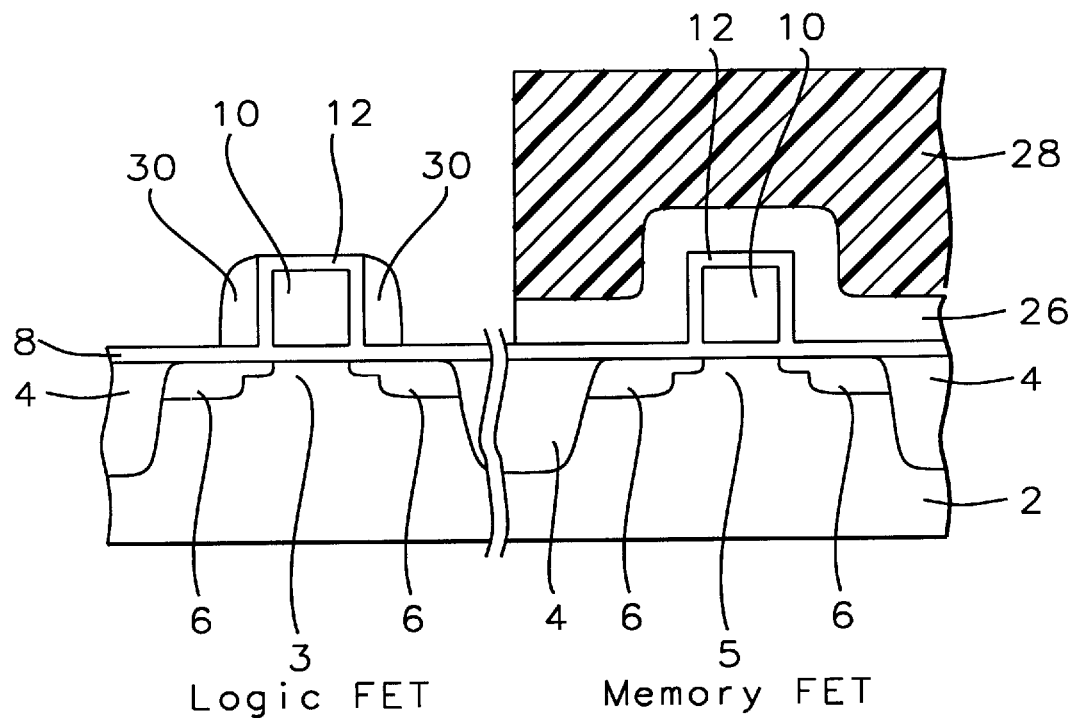

The silicon nitride sidewall spacers 14 shown in FIG. 1A are removed by an etching process, such as, a wet etch in hot phosphoric acid. FIG. 2 shows the polysilicon gate structures 10 and the polysilicon oxide 12. FIG. 3 shows a thick, layer of silicon nitride 26 ranging in thickness from approximately 500 Angstroms to approximately 1500 Angstroms, covering both types of FET's, logic FET 3 and memory FET 5. The silicon nitride 26 is deposited by LPCVD (Low Pressure Chemical Vapor Deposition). A silicide blockout mask 28 in FIG. 4 serves as a nitride etch protection mask for FET memory devices, while robust nitride sidewall spacers 30 in FIG. 5 are formed by an anisotropic etch using RIE, Reactive Ion Etching, on FET logic devices. The blockout mask 28 shown in FIG. 5 is subsequently removed by stripping the resist. Salicide formation process is applied by depositing metals, such as, Ti, Ta, Mo, W, Co, Ni, Pd, Pt onto the substrate. Low electrical resistance, good adhesion and low mechanical stress are some of the more desirable properties in choosing which metal to deposit. Silicide formation occurs by diffusion of silicon atoms through the polysilicon to the surface. In some instances, a two step RTA, Rapid Thermal Anneal, in an inert atmosphere converts the silicide from C49 crystal structure to the preferred C54 low electrical resistance structure. Salicide formation occurs in the exposed polysilicon areas and at the top of the source/drain areas, hence it is a self-aligned process. Deleterious bridging, which is silicide formation between the polysilicon and closely spaced source/drain regions is prevented by the robust silicon nitride sidewall structures.

The thick silicon nitride 26 silicide protection layer and nitride sidewall spacers 34, as shown in FIG. 6 are subsequently removed by selectively etching the nitride while leaving the oxide layers and salicide layers intact. This is one of the key aspects of the present invention.

In FIG. 6 selective salicide formation 32 is shown on all exposed silicon surfaces, that is, at the top of the polysilicon gate and in the diffusion regions. The silicon nitride spacers 34 that see exposure to the selective salicide processing metal do not react to form silicide.

Referring again to FIG. 6, sketched is the low electrical leakage region 36 which is formed as a direct result of the improved selective salicide process. Comparing the prior art structure 24 in FIG. 1B and structure 36 in FIG. 6, it can be plainly seen that the silicon oxide loss or recess in the field isolation region is significantly greater for structure 24. The reason for this effect is due to fact that the prior art or traditional process etches silicon oxide to form the salicide mask (self-aligned siuicide mask). Therefore, the field silicon oxide is also etched in the traditional process etch. This non-selective etch results in a recess in the field oxide region 24, FIG. 1B. These effects expose the silicon at the edge of the active source/drain regions where deleterious silicide formation occurs. This results in junction leakage. The present invention describes a process whereby silicon nitride can be the material that forms the salicide masking and can be selectively etched compared with the etch rate of silicon oxide. The selectively etch process minimizes the leakage problem.

In addition, after the salicide process is complete, said thick silicon nitride layer can be anisotropically etched to form sidewall spacers on the memory devices.

While the invention has been particularly shown and described with reference to the preferred embodiments thereof, it will be understood by those skilled in the art that various changes in form and details may be made without departing from the spirit and scope of the invention.

What is claimed is:

1. A method of forming MOSFET semiconductor devices on a semiconductor substrate using a selective salicide process for application in the fabrication of CMOS, complementary MOS transistors, comprising:

forming a semiconductor silicon substrata having field oxide regions for MOSPZT device isolation;

forming for gate oxide and polysilicon late structures on both n-channel and p-channel devices; thermally oxidizing said polysilicon gate structures to form silicon oxide on polysilicon gate structures;

depositing a first conformal silicon nitride layer over said substrate;

masking and anisotropically reactive ion etching (RIE) said silicon nitride layer to form gate sidewall spacers on said polysilicon gate structures;

patterning source/drain regions whereby said polysilicon gates are self-aligned;

forming by implantation source/drain regions associated with said polysilicon gate and sidewall spacer structures;

removing said silicon nitride sidewall spacers;

depositing a second conformal silicon nitride layer over said substrate;

forming a salicide blockout mask over memory devices, while exposing logic FET devices using said second conformal silicon nitride layer;

etching anisotropically said second silicon nitride to form second sidewall spacers on said logic devices;

removing said salicide blockout mask;

applying a salicide process of metal deposition and forming self-aligned silicide structures on exposed said logic FET devices, whereby there is formed low resistance lines and contacts on polysilicon gates and source/drain regions, while silicide formation is blocked on memory FET devices, by said second silicon nitride layer.

2. The method of claim 1, wherein the conformal silicon nitride layer ranges in thickness between approximately 500 Angstroms and 1500 Angstroms.

3. The method of claim 1, wherein said salicide process can be used for small geometry devices leas than one quarter micron lithography ground rules.

4. The method of claim 1, wherein the salicide process can be used for both p- and n-type transistors.

5. The method of claim 1, wherein said conformal silicon nitride layer can be deposited by Low Pressure Chemical Vapor Deposition, LPCO, in a wide range of deposition temperature and deposition conditions including: deposition temperatures from 500 to 800 degrees Celsius, various gas mixtures of ammonia and dicnlorosilane, and gas pressures from 100 milli-Torr to several Torr.

* * * * *